US 9,775,006 B2

(12) United States Patent
Oishi

(10) Patent No.: US 9,775,006 B2
(45) Date of Patent: Sep. 26, 2017

(54) AUDIO AMPLIFIER ACTIVATION DEVICE, AUDIO AMPLIFIER, AND REMOTE BROADCAST SYSTEM

(71) Applicant: QUESTAR INC., Saitama (JP)

(72) Inventor: Mamoru Oishi, Hokkaido (JP)

(73) Assignee: QUESTAR INC., Saitama (JP)

( * ) Notice: Subject to any disclaimer, the term of this patent is extended or adjusted under 35 U.S.C. 154(b) by 0 days.

(21) Appl. No.: 15/196,333

(22) Filed: Jun. 29, 2016

(65) Prior Publication Data
US 2016/0373900 A1 Dec. 22, 2016

Related U.S. Application Data

(63) Continuation of application No. PCT/JP2016/065747, filed on May 27, 2016.

(30) Foreign Application Priority Data

May 27, 2015 (JP) ................... 2015-106970
Oct. 16, 2015 (JP) ................... 2015-205094

(51) Int. Cl.
| H04M 11/04 | (2006.01) |
| H04W 4/06 | (2009.01) |
| H04L 29/08 | (2006.01) |
| H04B 1/3883 | (2015.01) |
| H03G 1/00 | (2006.01) |
| G08B 25/10 | (2006.01) |
| G08B 25/12 | (2006.01) |
| G08B 27/00 | (2006.01) |
| H04W 4/22 | (2009.01) |

(52) U.S. Cl.
CPC .............. *H04W 4/06* (2013.01); *G08B 25/10* (2013.01); *G08B 25/12* (2013.01); *G08B 27/00* (2013.01);
(Continued)

(58) Field of Classification Search
CPC .......... H04B 4/06; G08B 25/10; G08B 25/12; G08B 27/00
(Continued)

(56) References Cited

U.S. PATENT DOCUMENTS 6,509,833 B2 * 1/2003 Tate ..................... G08B 27/005
340/502
7,627,092 B2 * 12/2009 Contractor ............. H04M 11/04
379/37
(Continued)

FOREIGN PATENT DOCUMENTS

JP 10-312676 A 11/1998
JP 11-289232 A 10/1999
(Continued)

OTHER PUBLICATIONS

International Search Report dated Jul. 12, 2016, in connection with corresponding International Application No. PCT/JP2016/065747 (2 pgs.).

Primary Examiner — Sonny Trinh
(74) Attorney, Agent, or Firm — Maier & Maier, PLLC

(57) ABSTRACT

Provided is a remote broadcast system including an audio amplifier activation device configured to turn on when a level of input sound via a smartphone mobile unit exceeds a threshold, a power source for an audio amplifier configured to amplify a signal of the input sound into a broadcast audio signal, and output the broadcast audio signal to a broadcast loudspeaker, the audio amplifier activation device being configured also to turnoff the power source for the audio amplifier when the level of the input sound remains lower than the threshold for a predetermined time period. A broadcaster carrying a smartphone base unit can select a smartphone mobile station via the smartphone base unit, and establish a communication link between the smartphone base unit and the smartphone mobile station. With this, the broadcaster is allowed to broadcast evacuation guidance information even while evacuating.

4 Claims, 8 Drawing Sheets

(52) U.S. Cl.
CPC ......... *H03G 1/0088* (2013.01); *H04B 1/3883* (2013.01); *H04L 67/06* (2013.01); *H04L 67/10* (2013.01); *H04L 67/2814* (2013.01); *H04M 11/04* (2013.01); *H04W 4/22* (2013.01)

(58) Field of Classification Search
USPC ................................ 455/404.1, 521; 379/37
See application file for complete search history.

(56) References Cited

U.S. PATENT DOCUMENTS 8,265,938 B1 * 9/2012 Verna ................. G06F 17/2881
  379/37
9,378,638 B2 * 6/2016 Maity ................. G08B 27/005
2013/0278385 A1 * 10/2013 Baskin ............... H04W 76/007
  340/7.51

FOREIGN PATENT DOCUMENTS

| JP | 2003-308581 A | 10/2003 |
| JP | 2006-165674 A | 6/2006 |
| JP | 2010-130286 A | 6/2010 |
| JP | 2010-530658 A | 9/2010 |
| JP | 3187291 U | 11/2013 |
| JP | 2014-039352 A | 2/2014 |
| JP | 2014-112754 A | 6/2014 |
| JP | 2014-164640 A | 9/2014 |
| JP | 2015-33022 A | 2/2015 |

* cited by examiner

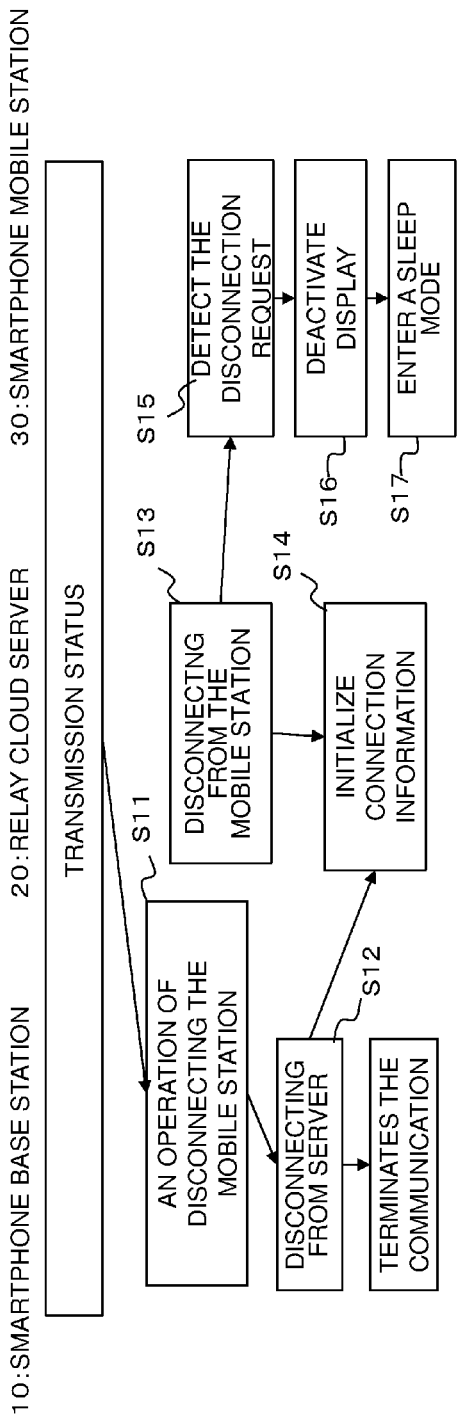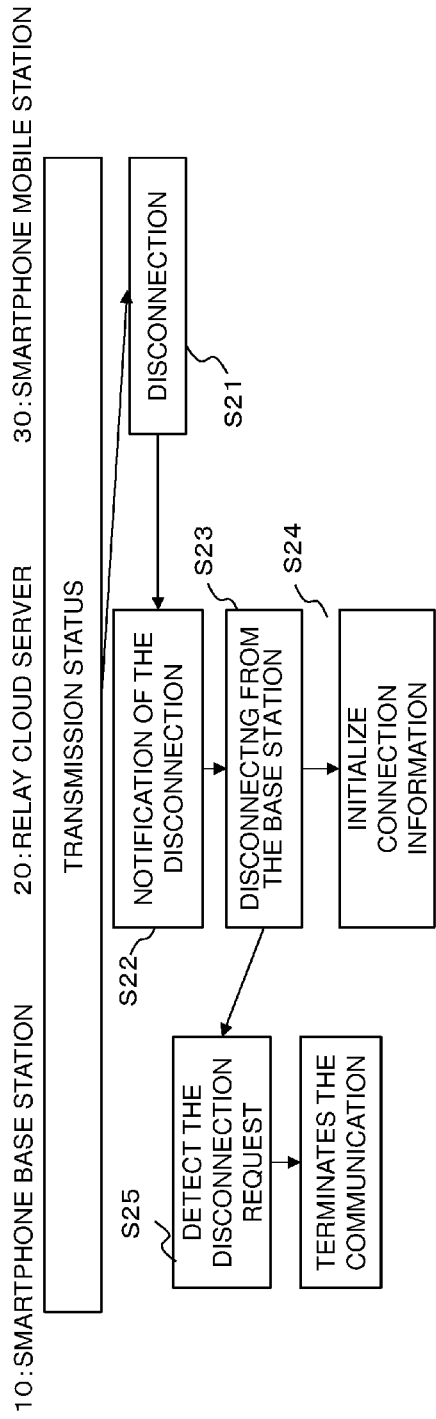

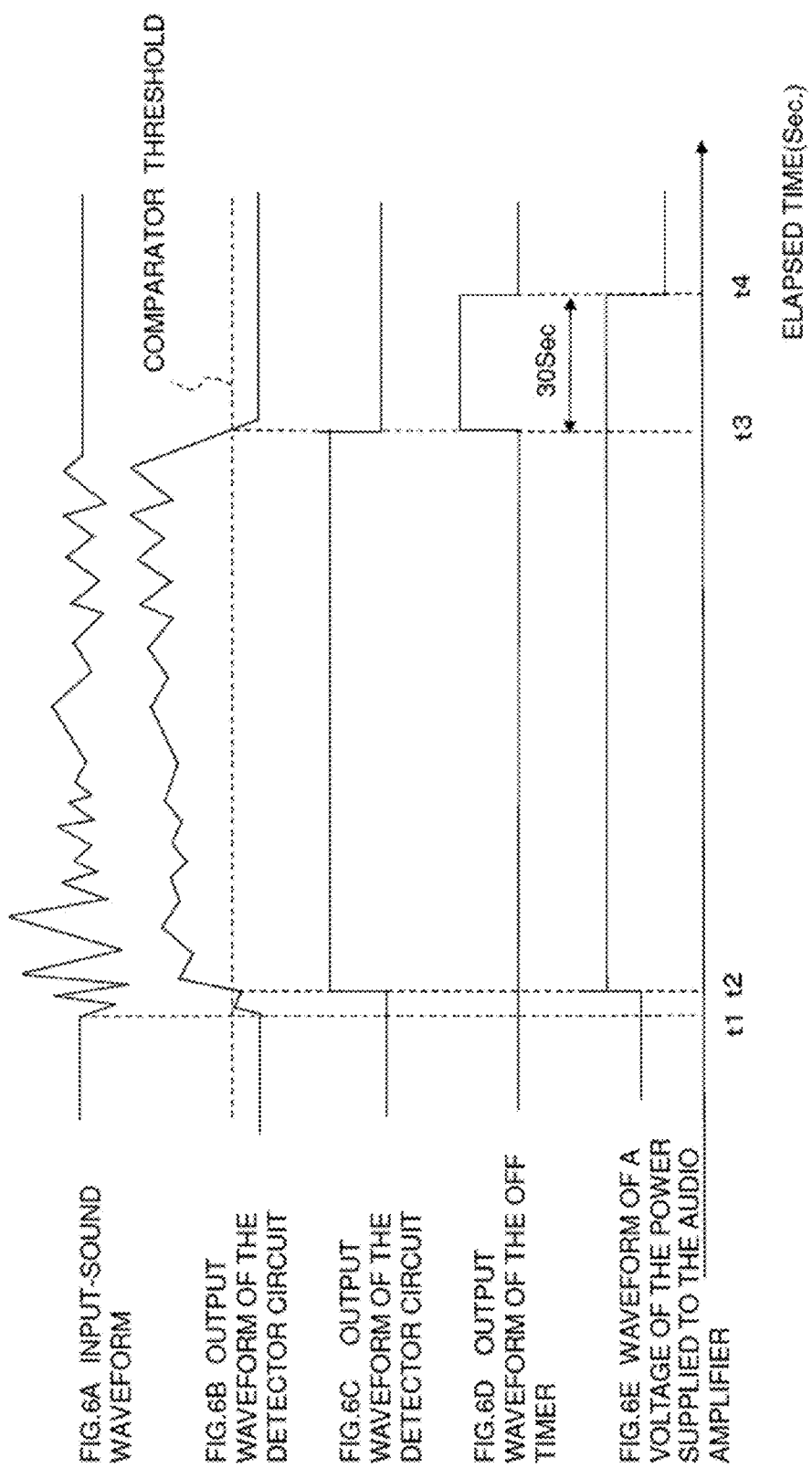

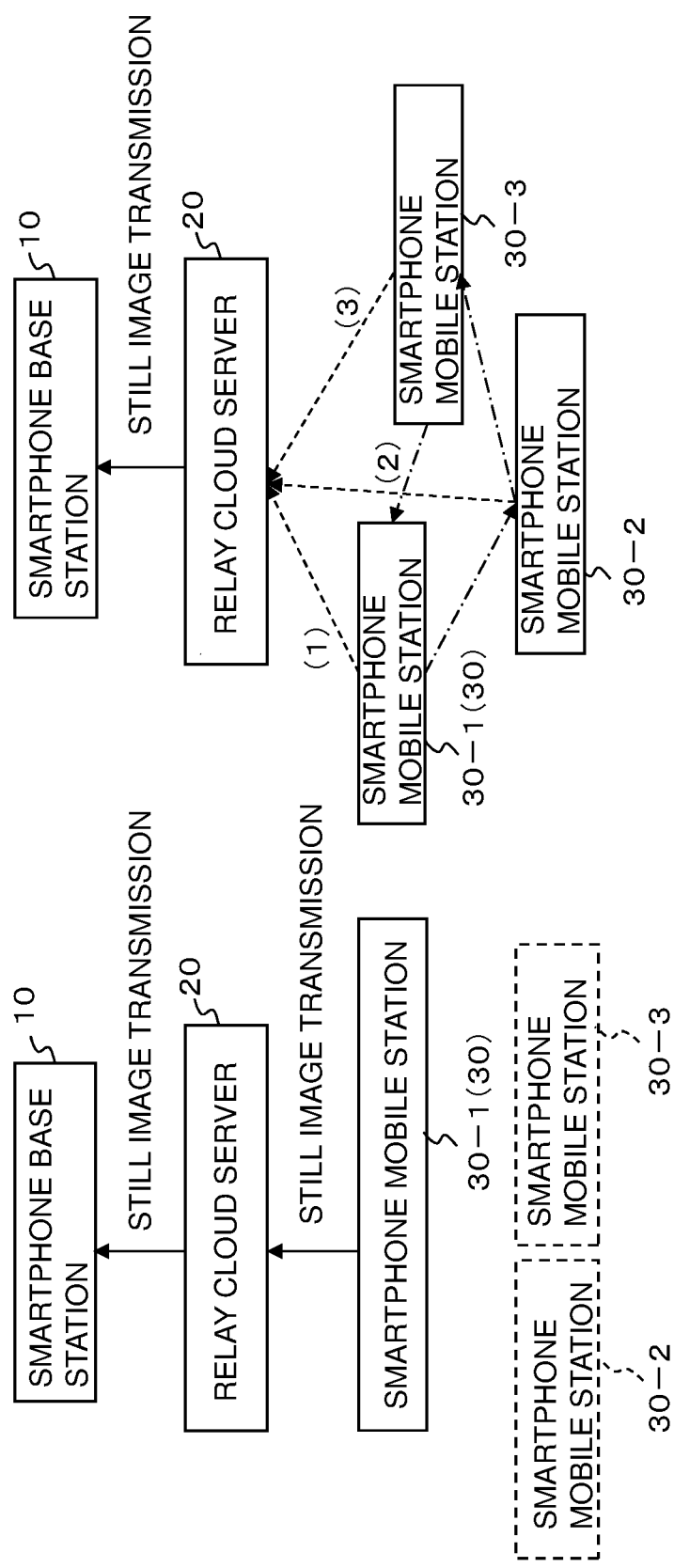

AUDIO AMPLIFIER ACTIVATION DEVICE, AUDIO AMPLIFIER, AND REMOTE BROADCAST SYSTEM

BACKGROUND

The present invention relates to an audio amplifier activation device, an audio amplifier, and a remote broadcast system.

A remote broadcast system configured to implement administrative broadcasting for delivering administrative information and event information in normal times, and implement emergency broadcasting for delivering disaster information in case of natural disasters have been commonly used among municipalities throughout the country. In this remote broadcast system, a base station configured to transmit broadcasts, and mobile stations configured to receive the broadcasts and announce the broadcasts to inhabitants, for example, via a loudspeaker are connected to each other in a wired or wireless manner.

In FIG. 1 of Japanese Patent Application Laid-open No. 2006-165674 (hereinafter, abbreviated as "Patent Literature 1"), there is disclosed a wireless emergency-management communication system including a base station BS, a relay station RS, and a plurality of mobile stations, in which bidirectional or unidirectional wireless communication is established between the base station BS and the mobile stations directly or via the relay station RS. In this system, conditions of the mobile stations are monitored by polling processes at predetermined intervals. With this, information items of the conditions of the mobile stations are gathered to the base station BS. The base station BS includes an operator console and a wireless apparatus. Based on the gathered information items of the conditions of the mobile stations, for example, a municipal staff member broadcasts the administrative information, the disaster information, and evacuation guidance information via a broadcast microphone connected to the operator console installed in a broadcast room of, for example, a government office.

Further, there is proposed an emergency-management audio distribution system as disclosed in Japanese Patent Application Laid-open No. 2014-112754 (hereinafter, abbreviated as "Patent Literature 2"). In this emergency-management audio distribution system, in case of natural disasters that require urgent measures, such as an earthquake and a tsunami, information terminals that have been commonly used among inhabitants, such as a smartphone and a feature phone, are utilized. With this, the inhabitants can view an emergency-management broadcast anytime and anywhere.

SUMMARY

In the wireless emergency-management communication system of Patent Literature 1, for example, the municipal staff member broadcasts the disaster information and the evacuation guidance information from the broadcast room of, for example, the government office. This is because, in order to properly evacuate inhabitants without causing confusion, the municipal staff member needs to sort out the disaster information and the evacuation guidance information to be broadcast from among various information items such as the information items of the conditions of the mobile stations, which are gathered, for example, to the government office. Generally, the government office and other facilities are constructed on a higher ground so as not to be affected by tsunamis and other natural disasters.

However, in the wireless emergency-management communication system of Patent Literature 1, a risk in that a building itself of the government office having the broadcast room therein is washed away by a tsunami to be caused by an unprecedentedly massive earthquake is not taken into consideration. The broadcaster needs to stay close to the operator console in the broadcast room. Thus, in case of natural disasters, specifically, in case where the tsunami accompanied by the unprecedentedly massive earthquake occurs in the future, there is a risk in that the broadcaster misses a chance to evacuate and is sacrificed.

Further, also in the emergency-management audio distribution system of Patent Literature 2, the risk in that the building itself of the government office having the broadcast room therein is washed away is not taken into consideration. In other words, the risk in that the broadcaster misses the chance to evacuate and is sacrificed in case of the natural disasters is not taken into consideration.

In view of the circumstances, the present invention has been made to achieve an object of providing an audio amplifier activation device, an audio amplifier, and a remote broadcast system that allow a broadcaster to broadcast evacuation guidance information even while the broadcaster himself/herself evacuates.

According to a first aspect of the present invention, there is provided an audio amplifier activation device configured to turn on, when a level of input sound that is input via a smartphone mobile unit via Bluetooth or a cable exceeds a threshold, an audio amplifier configured to amplify a signal of the input sound into a broadcast audio signal, and output the broadcast audio signal to a broadcast loudspeaker, the audio amplifier activation device being configured also to turn off the audio amplifier when the level of the input sound remains lower than the threshold for a predetermined time period.

According to a second embodiment of the present invention, there is provided an audio amplifier configured to amplify input sound, which is input via a smartphone mobile unit via Bluetooth or a cable, into a broadcast audio signal, and to output the broadcast audio signal to a broadcast loudspeaker. When a level of the input sound exceeds a threshold, the audio amplifier is turned on, amplifies a signal of the input sound into the broadcast audio signal, and outputs the broadcast audio signal to the broadcast loudspeaker. When the level of the input sound remains lower than the threshold for a predetermined time period, the audio amplifier is turned off.

According to a third aspect of the present invention, there is provided a remote broadcast system, including a communication link that constitutes a smartphone system, and includes a smartphone base station and a plurality of smartphone mobile stations, the smartphone base station and the plurality of smartphone mobile stations being connected communicably to each other via the communication link, the smartphone base station including a smartphone base unit, the plurality of smartphone mobile stations respectively including smartphone mobile units, the plurality of smartphone mobile stations each including
    an audio amplifier configured to amplify, when electric power is supplied to the audio amplifier, input sound via corresponding one of the smartphone mobile units into a broadcast audio signal, and to output the broadcast audio signal,
    an audio amplifier activation device configured to receive the input sound via the corresponding one of the smartphone mobile units, turn on the audio amplifier when a level of the input sound exceeds a threshold, and turn off the audio amplifier when the level of the input sound remains lower than the threshold for a predetermined time period, and a broadcast loudspeaker configured to receive the broadcast audio signal, and broadcast the broadcast audio signal as broadcast sound, the smartphone base unit being configured to select at least one of the smartphone mobile units, and cause the at least one of the smartphone mobile units to output the broadcast sound via the broadcast loudspeaker that is connected to the at least one of the smartphone mobile units via the audio amplifier, the smartphone mobile units each being configured to transmit one of streaming videos and still images of a scene around corresponding one of the plurality of smartphone mobile stations to the smartphone base unit at predetermined time intervals.

The audio amplifier activation device of each of the plurality of smartphone mobile stations of the remote broadcast system according to the third embodiment of the present invention is configured to turn on, when the level of the input sound via corresponding one of the smartphone mobile units exceeds the threshold, a power source for the audio amplifier configured to amplify the signal of the input sound into the broadcast audio signal, and output the broadcast audio signal to the broadcast loudspeaker. The audio amplifier activation device is configured also to turn off the power source for the audio amplifier when the level of the input sound remains lower than the threshold for the predetermined time period. A broadcaster carrying the smartphone base unit can select at least one of the plurality of smartphone mobile stations via the smartphone base unit, and establish a communication link between the smartphone base unit and the at least one of the plurality of smartphone mobile stations. With this, the broadcaster is allowed to broadcast evacuation guidance information even while evacuating.

Further, the plurality of smartphone mobile stations of the remote broadcast system according to the third embodiment of the present invention are each configured to transmit the one of the streaming videos and the still images of the scene around corresponding one of the plurality of smartphone mobile stations to the smartphone base station at the predetermined time intervals. With this, the broadcaster can gather the one of the streaming videos and the still images of the scene around the corresponding one of the plurality of smartphone mobile stations even while traveling. Thus, in case of natural disasters, a necessity that the broadcaster stays in a broadcast room for gathering information can be reduced. As a result, a risk in that the broadcaster misses a chance to evacuate as a result of staying in the broadcast room and is sacrificed is reduced.

BRIEF DESCRIPTION OF DRAWINGS

FIG. 5A is a sequence diagram showing a communication interruption procedure in the remote broadcast system according to the embodiment of the present invention;

FIG. 5B is a sequence diagram showing a communication interruption procedure in the remote broadcast system according to the embodiment of the present invention;

FIG. 6A is a timing chart showing an operation of the audio amplifier activation device in FIG. 2;

FIG. 6B is a timing chart showing an operation of the audio amplifier activation device in FIG. 2;

FIG. 6C is a timing chart showing an operation of the audio amplifier activation device in FIG. 2;

FIG. 6D is a timing chart showing an operation of the audio amplifier activation device in FIG. 2;

FIG. 6E is a timing chart showing an operation of the audio amplifier activation device in FIG. 2;

FIG. 8A is a diagram showing a procedure for gathering streaming videos or still images in the remote broadcast system according to the embodiment of the present invention.

FIG. 8B is a diagram showing a procedure for gathering streaming videos or still images in the remote broadcast system according to the embodiment of the present invention.

DETAILED DESCRIPTION OF EMBODIMENT

Now, an embodiment of the present invention is described in detail with reference to the drawings.

(System Configuration According to Embodiment)

Figure 1:
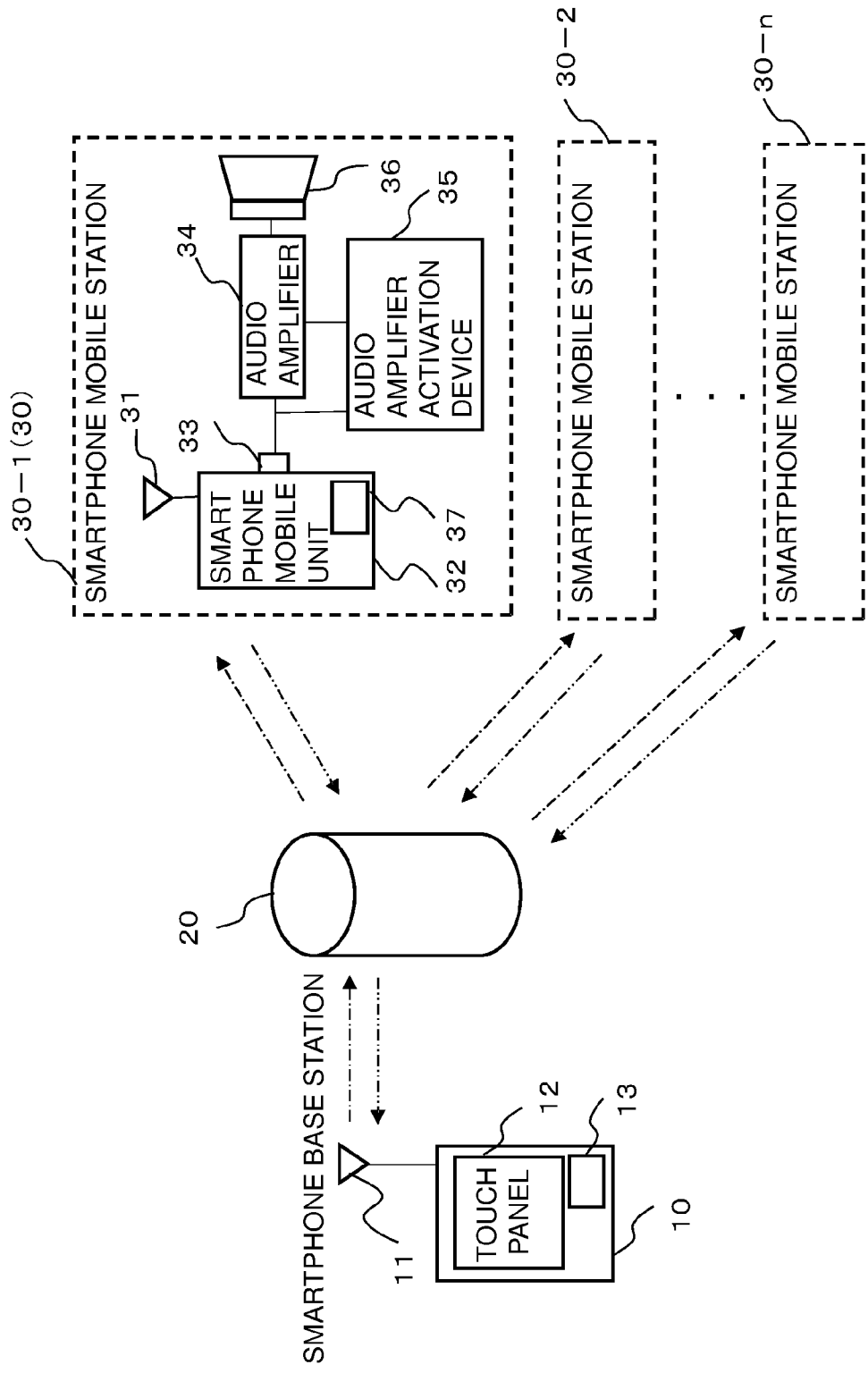
FIG. 1 is a system configuration diagram showing an outline of a remote broadcast system according to an embodiment of the present invention.

FIG. 1 is a system configuration diagram showing an outline of a remote broadcast system according to the embodiment of the present invention.

The remote broadcast system according to the embodiment of the present invention is a system including a communication link (hereinafter, also referred to as "network" or "cloud"). The communication link constitutes a smartphone system (hereinafter, abbreviated as "smartphone"), and includes a smartphone base station 10 and a plurality of smartphone mobile stations 30 (including 30-1, 30-2, . . . , and 30-n), which are connected communicably to each other via the communication link. The communication link includes a relay cloud server 20.

The relay cloud server 20 has the following functions. The relay cloud server 20 maintains, as an audio file, an audio broadcast that is recorded via the smartphone base station 10 or a personal computer (not shown) and is transferred therefrom, and, at preset broadcast timings and a preset number of repetition times, transfers this audio file to the smartphone mobile stations 30 and broadcasts this audio file. Further, the relay cloud server 20 also performs voice synthesis of a text message that is input to the smartphone base station 10 or the personal computer (not shown) and is transferred therefrom so as to generate an audio file, maintains this audio file, and, at preset broadcast timings and a preset number of repetition times, transfers this audio file to the smartphone mobile stations 30 and broadcasts this audio file.

Note that, as the communication link, although not shown, a Wi-Fi link, a Bluetooth (trademark) link, and a mobile link may be used alone or in combination with each other.

The smartphone base station 10 includes a smartphone base unit provided with at least an antenna 11, a touch panel 12, and a microphone 13. The touch panel 12 functions as an operation panel configured to display selectable ones of the smartphone mobile stations 30, and selectable ones of broadcast modes described below, such as a recording-reproducing mode and a phone call mode. Further, the touch panel 12 functions also as a display panel configured to display still images and streaming videos transmitted from selected ones of the smartphone mobile stations 30.

The smartphone mobile stations 30 each include a smartphone mobile unit 32 provided with at least an antenna 31, an audio output terminal 33, and a camera 37, and include an audio amplifier 34, an audio amplifier activation device 35, and a broadcast loudspeaker 36.

The smartphone base station 10 has a function to select one or all of the smartphone mobile stations 30 belonging to the remote broadcast system according to the embodiment of the present invention, and cause selected one of the smartphone mobile stations 30 to output and deliver broadcast voice of a broadcaster via the broadcast loudspeaker 36 of the selected one of the smartphone mobile stations 30, the broadcast voice being received via the microphone 13. The smartphone base station 10 is configured to allow selection from among broadcasts such as a siren, a chime, and radio gymnastics via the touch panel 12.

Further, the selected one of the smartphone mobile stations 30, which is selected via the smartphone base station 10, transmits streaming videos or still images of a scene around the smartphone mobile station 30, which are captured by the camera 37, to the smartphone base station 10 at predetermined time intervals (for example, 1 second).

Note that, the above-described remote broadcast system is referred to as "SMAHOU CLOUD" (pending trademark) system, and a combination of existing emergency-management systems and this "SMAHOU CLOUD" system is referred to as "SMAHOU BRIDGE" (pending trademark).

(Configuration of Audio Amplifier Activation Device)

Figure 2:
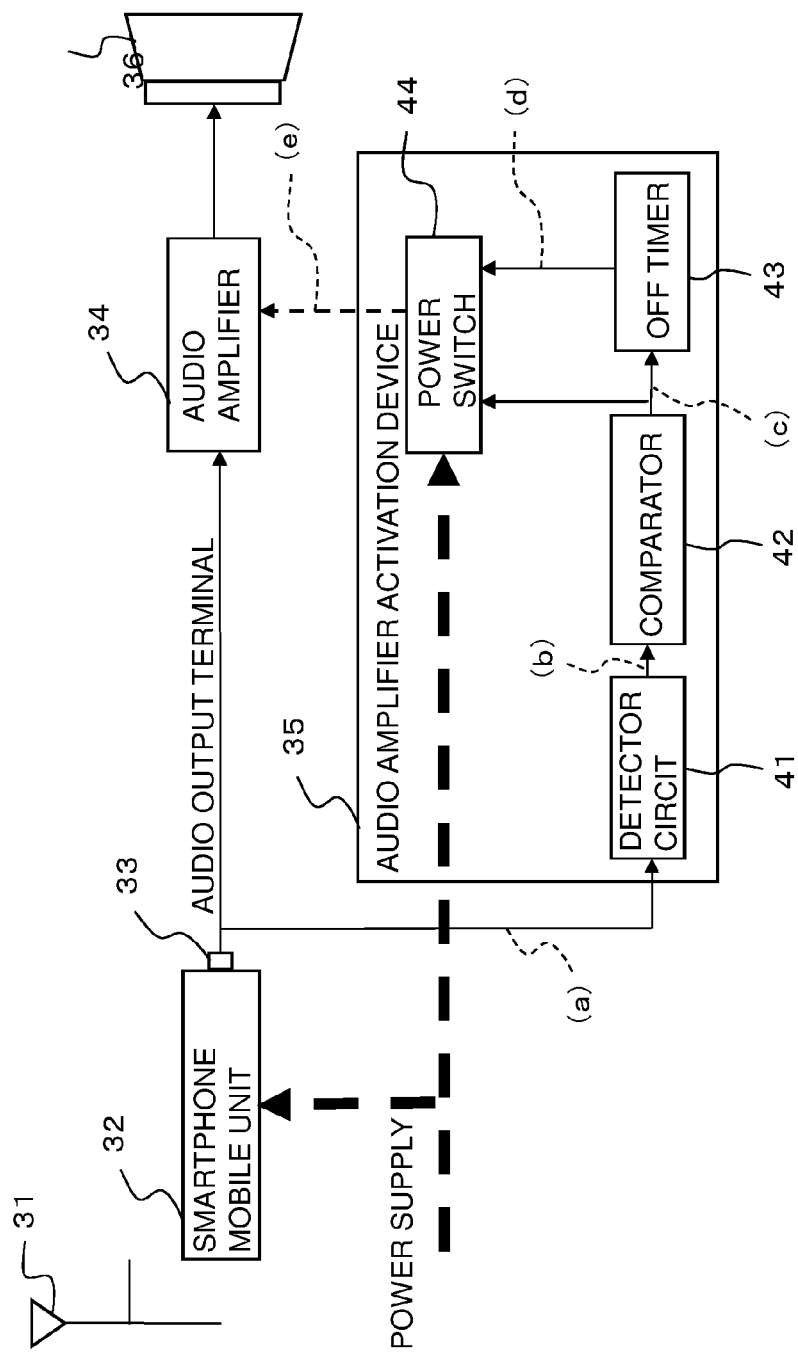
FIG. 2 is a function block diagram showing an outline of a function of an audio amplifier activation device in FIG. 1.

FIG. 2 is a function block diagram showing an outline of a function of the audio amplifier activation device 35 in FIG. 1.

The audio amplifier activation device 35 includes a detector circuit 41 configured to detect output of sound (a) that is input via the smartphone mobile unit 32, and to output a direct-current voltage (b), a comparator 42 configured to output, for example, "1" as an arithmetic result (c) when the direct-current voltage (b) output from the detector circuit 41 exceeds a threshold of the comparator 42, a power switch 44 configured to be turned on when the comparator 42 outputs "1" as the arithmetic result (c) and to supply electric power (e) to the audio amplifier 34, and an OFF timer 43 configured to be activated when the direct-current voltage (b) output from the detector circuit 41 is lower than the threshold, to count a predetermined time period (for example, 30 seconds), and to turn off the power switch 44 after elapse of the predetermined time period, thereby interrupting the supply of the electric power (e) to the audio amplifier 34.

In order to reduce echoes to be generated by a feedback loop from an output to an input, an acoustic feedback-and-echo cancellation function using, for example, phase inversion and phase delay is added to the audio amplifier 34.

The detector circuit 41 includes a detection diode, resistors, and capacitors (not shown). The comparator 42 includes an operational amplifier and resistors (not shown). Examples of the OFF timer 43 include a digital counter (not shown), and a time constant circuit including resistors and capacitors (not shown). Examples of the power switch 44 include a switching element having a low ON resistance, such as an NPN transistor (not shown).

Figure 3:
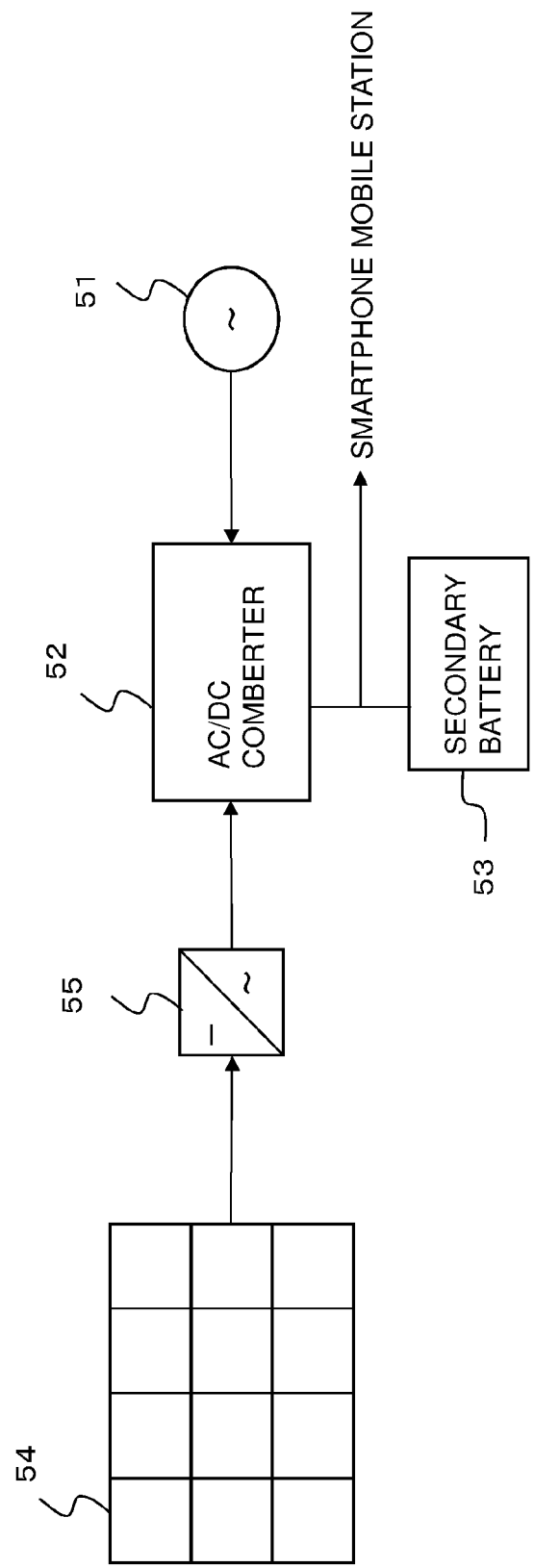
FIG. 3 is a diagram showing a power supply system for a smartphone mobile station.

FIG. 3 is a diagram showing a power supply system for the smartphone mobile station 30. A commercial power source 51 and a solar cell module 54 are connected to the smartphone mobile station 30. An alternating voltage of 100 V (50 Hz/60 Hz) supplied from the commercial power source 51 is converted by an AC/DC converter 52, and supplied as direct-current power to the smartphone mobile station 30. Direct-current power output from the solar cell module 54 is converted to alternating-current power by an inverter 55, then converted by the AC/DC converter 52, and supplied as direct-current power to the smartphone mobile station 30. Further, to an output terminal of the AC/DC converter 52, a secondary battery 53 for backup in case of a power failure is connected.

Note that, a photovoltaics remote broadcast system in which the solar cell module as shown in FIG. 3 is used as a backup power source is referred to as "SMAHOU STATION."

(Operation of System of Embodiment)

An operation of the remote broadcast system according to the embodiment of the present invention, specifically, (I) Communication Establishment Procedure in System, (II) Communication Interruption Procedures in System, (III) Procedure of Audio Broadcasting, and (IV) Procedures for Gathering Streaming Videos or Still Images are independently described.

(I) Communication Establishment Procedure in System

Figure 4:
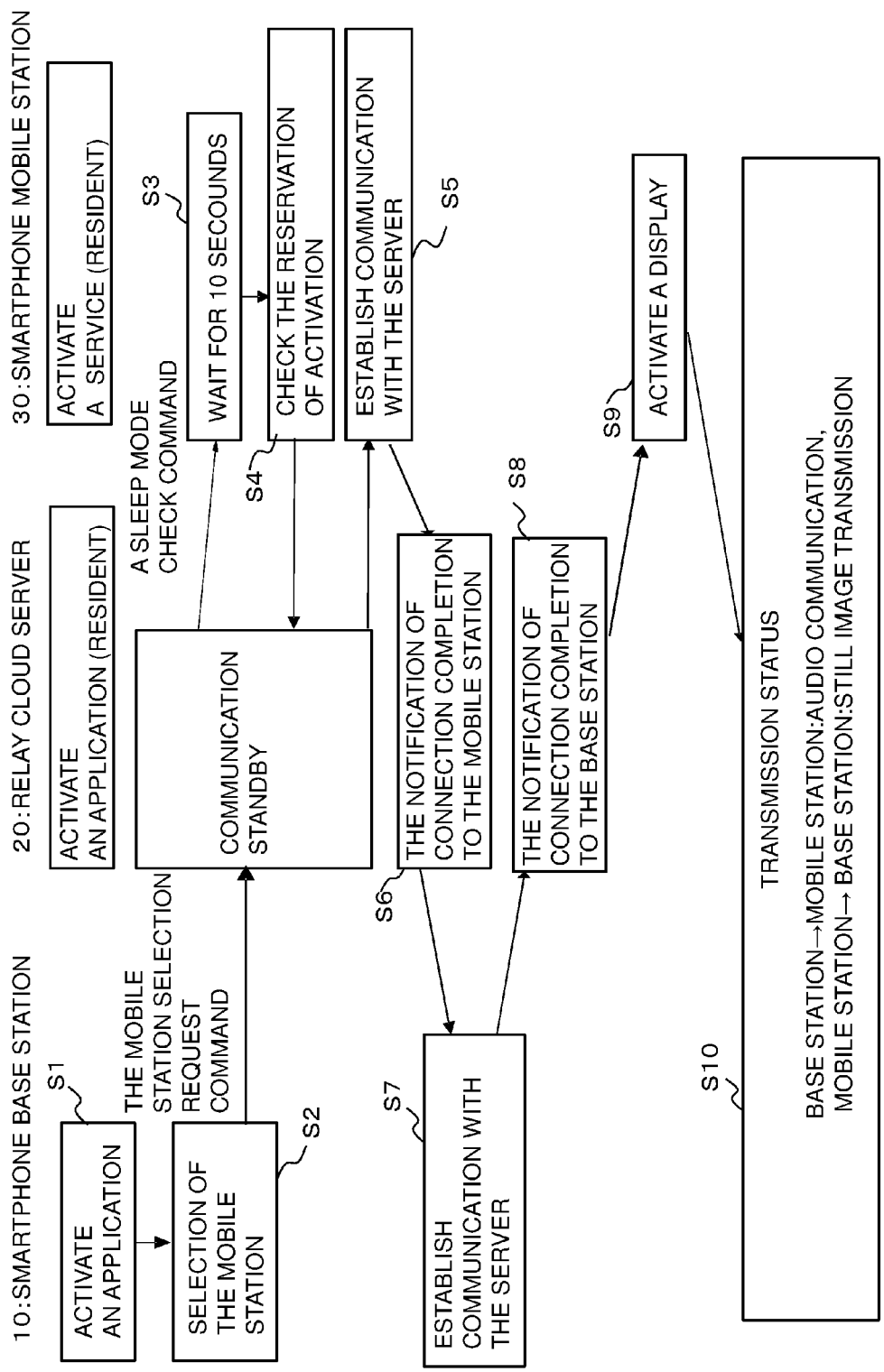
FIG. 4 is a sequence diagram showing a communication establishment procedure in the remote broadcast system according to the embodiment of the present invention.

FIG. 4 is a sequence diagram showing a communication establishment procedure in the remote broadcast system according to the embodiment of the present invention.

With reference to FIG. 1 and the sequence diagram shown in FIG. 4, the communication establishment procedure according to the embodiment of the present invention is described.

In Step S1, when an application is activated in the smartphone base station 10, the smartphone base station 10 searches for selectable ones of the smartphone mobile stations 30 within from approximately 3 seconds to approximately 10 seconds. Then, the selectable ones of the smartphone mobile stations 30 are displayed on the touch panel 12, and the procedure proceeds to Step S2. In Step S2, when at least one is selected from the selectable ones of the smartphone mobile stations 30, which are displayed on the touch panel 12, the smartphone base station 10 transmits a mobile station selection request command to the relay cloud server 20. Then, the relay cloud server 20 that has received the mobile station selection request command transmits a sleep mode check command to the selected one of the smartphone mobile stations 30, and the procedure proceeds to Step S3. In Step S3, this smartphone mobile station 30 waits for 10 seconds. Then, the procedure proceeds to Step S4.

In Step S4, the smartphone mobile station 30 checks whether or not activation has been reserved, and returns a checking result that the activation has been reserved to the relay cloud server 20. Then, the procedure proceeds to Step S5. In Step S5, the smartphone mobile station 30 establishes a communication between the relay cloud server 20 and the smartphone mobile station 30. Then, the procedure proceeds to Step S6.

In Step S6, the relay cloud server 20 notifies the smartphone base station 10 that the communication between the relay cloud server 20 and the smartphone mobile station 30 has been established. Then, the procedure proceeds to Step S7. In Step S7, the smartphone base station 10 determines that the communication between the relay cloud server 20 and the smartphone mobile station 30 has been established, and establishes a communication between the smartphone base station 10 and the relay cloud server 20. Then, the procedure proceeds to Step S8. In Step S8, the relay cloud server 20 notifies the smartphone mobile station 30 that the communication between the relay cloud server 20 and the smartphone base station 10 has been established. Then, the procedure proceeds to Step S9. In Step S9, a display of the smartphone mobile station 30 is activated, and a communication mode is started. The communication mode in this case refers to a mode in which a downstream audio communication from the smartphone base station 10 to the smartphone mobile station 30 is established via the relay cloud server 20, and in which an upstream transmission of the streaming videos or the still images from the smartphone mobile station 30 to the smartphone base station 10 is performed via the relay cloud server 20.

(II) Communication Interruption Procedures in System

FIG. 5A and FIG. 5B are each a sequence diagram showing a communication interruption procedure in the remote broadcast system according to the embodiment of the present invention.

First, with reference to FIG. 5A showing a connection interruption procedure from the base station side, in Step S11, an operation of disconnecting the mobile station is input via the touch panel 12 of the smartphone base station 10. Then, the procedure proceeds to Step S12. In Step S12, a disconnection request command is transmitted from the smartphone base station 10 to the relay cloud server 20. Then, the procedure proceeds to Step S13. In Step S13, a command of requesting disconnection from the relay cloud server 20 is transmitted from the relay cloud server 20 to the smartphone mobile station 30. Then, in Step S14, the relay cloud server 20 initializes connection information.

In Step S15, the smartphone mobile station 30 detects the disconnection request. Then, the procedure proceeds to Step S16. In Step S16, the smartphone mobile station 30 deactivates its display. Then, the procedure proceeds to Step S17. In Step S17, the smartphone mobile station 30 enters a sleep mode.

Next, with reference to FIG. 5B showing a connection interruption procedure from the mobile station side, when an event of the disconnection occurs in the smartphone mobile station 30 in Step S21, the procedure proceeds to Step S22. In this case, the event of the disconnection in the smartphone mobile station 30 corresponds, for example, to a case where the downstream audio broadcasting from the smartphone base station 10 to the smartphone mobile station is stopped for 10 minutes. Such cases corresponding to the event of the disconnection are predetermined.

In Step S22, the relay cloud server 20 receives a notification of the disconnection. Then, the procedure proceeds to Step S23. In Step S23, the relay cloud server 20 notifies the smartphone base station 10 that the disconnection has occurred. Then, the procedure proceeds to Step S24, and the connection information is initialized.

In Step S25, the smartphone base station 10 detects the disconnection, and terminates the communication.

(III) Procedure of Audio Broadcasting

Figure 7:
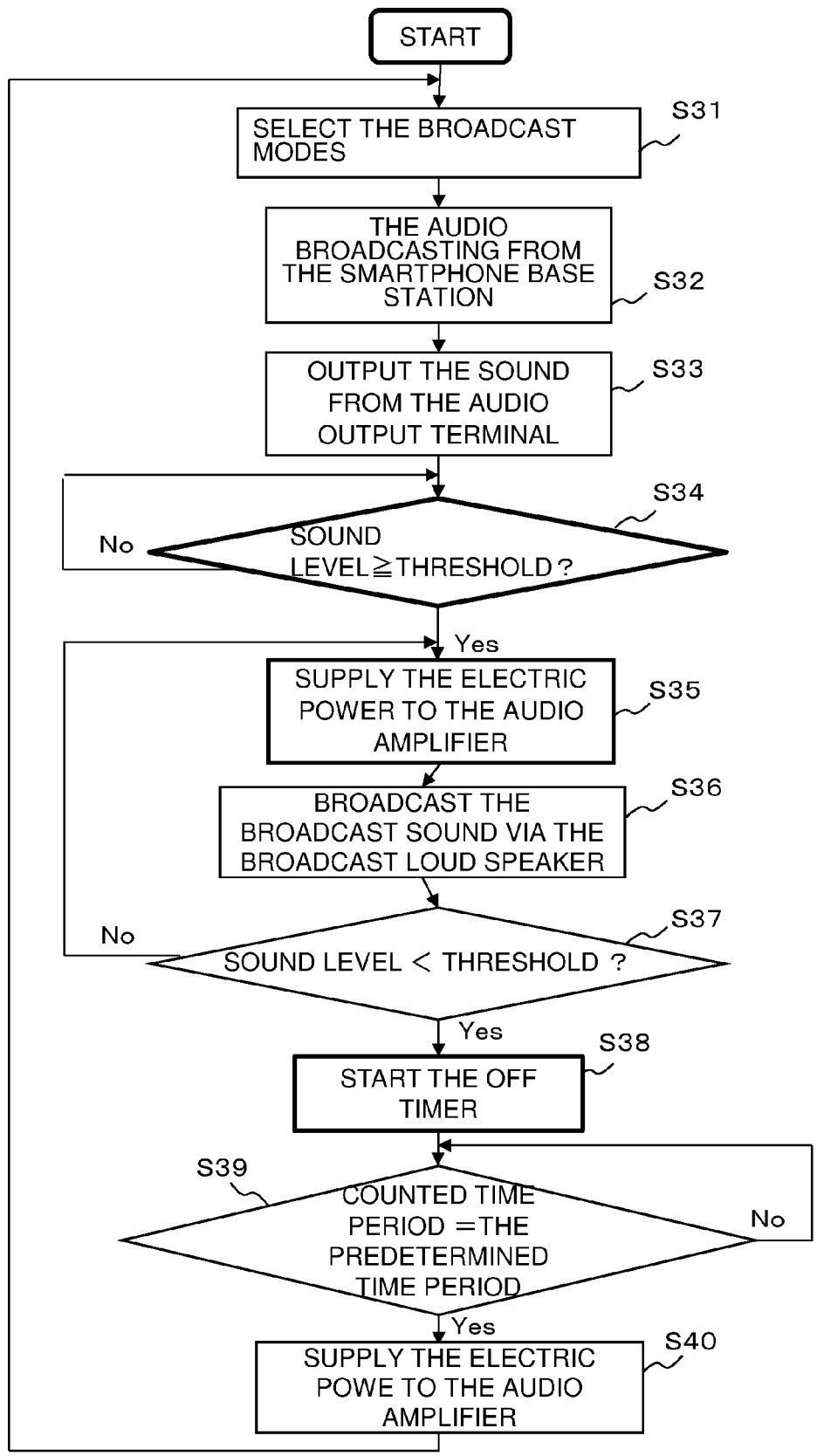
FIG. 7 is a flowchart showing a procedure of audio broadcasting in the remote broadcast system according to the embodiment of the present invention.

FIG. 6A to FIG. 6E are timing charts showing an operation of the audio amplifier activation device 35 in FIG. 2. FIG. 6A shows an input-sound waveform. FIG. 6B shows an output waveform of the detector circuit 41. FIG. 6C shows an output waveform of the comparator 42. FIG. 6D shows an output waveform of the OFF timer 43. Further, FIG. 6E shows a waveform of a voltage of the power supplied to the audio amplifier 34. In addition, FIG. 7 is a flowchart showing a procedure of audio broadcasting in the remote broadcast system according to the embodiment of the present invention. Note that, the procedure in FIG. 7 is executed under a state in which the communication is established.

With reference to FIG. 1, FIG. 2, FIG. 6, and the flowchart shown in FIG. 7, the procedure of the audio broadcasting according to the embodiment of the present invention is described.

In FIG. 7, the procedure is started and proceeds to Step S31. In the smartphone base station 10, selection of either of the broadcast modes is performed. Specifically, the touch panel 12 displays a selection menu listing the recording-reproducing mode of reproducing and broadcasting recordings such as the siren, the chime, and the radio gymnastics, and the phone call mode of receiving voice of a broadcaster via the microphone 13. When the broadcaster touches and selects either of the broadcast modes on the touch panel 12, the procedure proceeds to Step S32.

In Step S32, the audio broadcasting from the smartphone base station 10 is started. Then, the procedure proceeds to Step S33. In Step S33, the sound (a) is output from the audio output terminal 33 of the smartphone mobile unit 32 of the smartphone mobile station 30 to the audio amplifier activation device 35. Then, the procedure proceeds to Step S34 (refer to FIG. 2).

With reference to FIG. 2 and FIG. 6, until a timing t1, the sound (a) has not yet been output from the audio output terminal 33 of the smartphone mobile unit 32. The output voltage (b) from the detector circuit 41 in FIG. 2 is 0 V, and hence the arithmetic result (c) output from the comparator 42 is "0." Thus, the direct-current power (e) is not supplied to the audio amplifier 34.

In Step S34, when the direct-current voltage (b) output from the detector circuit 41 in FIG. 2 exceeds the threshold of the comparator 42, the procedure proceeds to Step S35. In Step S35, the electric power (e) is supplied to the audio amplifier 34. Then, the procedure proceeds to Step S36, and the broadcast sound is broadcast via the broadcast loudspeaker 36. Then, the procedure proceeds to Step S37.

With reference to FIG. 6A and FIG. 6B, between the timing t1 and a timing t2, the sound (a) starts to be output from the audio output terminal 33 of the smartphone mobile unit 32. However, until the timing t2, the output voltage (b) from the detector circuit 41 remains lower than the threshold, and hence the arithmetic result (c) output from the comparator 42 is "0." Thus, the direct-current power (e) is not supplied to the audio amplifier 34.

Between the timing t2 and a timing t3, the voltage (b) of the output waveform from the detector circuit 41 remains equal to or higher than the threshold, and hence the arithmetic result (c) output from the comparator 42 remains "1." Thus, the electric power (e) is supplied to the audio amplifier 34.

As long as the direct-current voltage (b) output from the detector circuit 41 in FIG. 2 remains equal to or higher than the threshold of the comparator 42 ("No" in Step S37), the processes of Step S35 to Step S37 are repeated such that the broadcast sound continues to be broadcast via the broadcast loudspeaker 36. In a case where the direct-current voltage (b) output from the detector circuit 41 in FIG. 2 has become lower than the threshold of the comparator 42 ("Yes" in Step S37), the procedure proceeds to Step S38. In Step S38, the OFF timer 43 starts to count a predetermined time period of, for example, 30 seconds from the timing t3 when the arithmetic result (c) output from the comparator 42 in FIG. 2 changes from "1" to "0." Then, the procedure proceeds to Step S39. When a counted time period reaches the predetermined time period ("Yes" in Step S39), the procedure proceeds to Step S40.

In Step S40, the supply of the electric power (e) to the audio amplifier 34 is interrupted. Then, the procedure returns to Step S31.

With reference to FIG. 6, at the timing t3 and in a time period subsequent thereto, the direct-current voltage (b) output from the detector circuit 41 remains lower than the threshold. Thus, at the timing t3, the OFF timer 43 is activated and counts the predetermined time period of, for example, 30 seconds. The OFF timer 43 continues to output "1" as an arithmetic result (d) during the counting of the predetermined time period, and outputs "0" as the arithmetic result (d) at a timing t4 and in a time period subsequent thereto after the elapse of the predetermined time period.

Between the timing t2 and the timing t4, the electric power (e) continues to be supplied to the audio amplifier 34, and the broadcast sound continues to be broadcast via the broadcast loudspeaker 36. At the timing t4 and in the time period subsequent thereto, the supply of the electric power (e) to the audio amplifier 34 is interrupted.

(IV) Procedures for Gathering Streaming Videos or Still Images

FIG. 8A and FIG. 8B are each a diagram showing a procedure for gathering streaming videos or still images in the remote broadcast system according to the embodiment of the present invention. In the procedure shown in the diagram of FIG. 8A, the streaming videos or the still images are gathered from selected one of the smartphone mobile stations 30. In the procedure shown in the diagram of FIG. 8B, the streaming videos or the still images are gathered from all of the smartphone mobile stations 30 belonging to the system.

First, with reference to FIG. 8A, a streaming video or a still image is transmitted from a selected smartphone mobile station 30 to the smartphone base station 10 via the relay cloud server 20. The camera 37 of the smartphone mobile unit 32 in FIG. 1 captures a scene around the smartphone mobile station 30-1, and still images or streaming videos of this scene are transmitted at intervals of, for example, 1 second from the smartphone mobile station 30-1 to the relay cloud server 20. The relay cloud server 20 relays the still images or the streaming videos transmitted from the smartphone mobile station 30-1, and transmits those videos or images to the smartphone base station 10. On the touch panel 12 of the smartphone base station 10, the streaming videos or the still images of the scene around the smartphone mobile station 30-1 are displayed on a frame-by-frame basis at the intervals of 1 second.

Next, with reference to FIG. 8B, three smartphone mobile stations 30-1, 30-2, and 30-3 are connected to the smartphone base station 10 via a communication link and the relay cloud server 20. For example, in an order of (1) the smartphone mobile station 30-1, (2) the smartphone mobile station 30-2, (3) the smartphone mobile station 30-3, and (1) the smartphone mobile station 30-1, still images or streaming videos of scenes around those smartphone mobile stations 30 are transmitted at intervals of, for example, 1 second from the smartphone mobile stations 30 to the relay cloud server 20. The relay cloud server transfers the still images or the streaming videos transmitted sequentially from the three smartphone mobile stations 30-1, 30-2, and 30-3 to the smartphone base station 10 in this order. On the touch panel 12 of the smartphone base station 10, in an order of (1) the smartphone mobile station 30-1, (2) the smartphone mobile station 30-2, and (3) the smartphone mobile station 30-3, the still images or the streaming videos of the scenes around those smartphone mobile stations 30 are displayed on a frame-by-frame basis at the intervals of 1 second.

(Advantages of Embodiment)

According to the audio amplifier activation device of the embodiment of the present invention, when a level of the input sound via the smartphone mobile unit exceeds the threshold, the power source for the audio amplifier is turned on. When the level of this input sound remains lower than the threshold for a predetermined time period, the power source for the audio amplifier is turned off. With this, power consumption during a standby mode of batteries as power sources for the smartphone mobile station and the audio amplifier is reduced.

According to the remote broadcast system of the embodiment of the present invention, the smartphone base unit selects one or all of the smartphone mobile units, and causes selected one of the smartphone mobile unit to output broadcast sound via the broadcast loudspeaker that is connected to the selected one of the smartphone mobile unit via the audio amplifier. Further, streaming videos or still images of a scene around the smartphone mobile station are transmitted from the smartphone mobile station to the smartphone base station at predetermined time intervals. With this, a broadcaster carrying the smartphone base unit can gather the streaming videos or the still images of the scene around the smartphone mobile station. Thus, the broadcaster can monitor the scene around the smartphone mobile station even while traveling. As a result, disaster information and evacuation guidance information can be properly broadcast.

(Modification)

In the above description of the audio amplifier activation device according to the embodiment of the present invention, when the level of the input sound via the smartphone mobile unit exceeds the threshold, the power source for the audio amplifier configured to amplify an input audio signal into a broadcast audio signal, and output this broadcast audio signal to the broadcast loudspeaker is turned on. However, when to turn on the power source for the audio amplifier is not limited to the timing when the level of the input sound exceeds the threshold. For example, a motion sensor (not shown) may be arranged in the smartphone mobile station, and the power source for the audio amplifier may be turned on when the motion sensor detects an impact exceeding a preset threshold level.

In FIG. 1 showing the outline of the remote broadcast system according to the embodiment of the present invention and in the description thereof, the smartphone mobile station is assumed as a stationary station. However, the smartphone mobile station is not limited to the stationary station. Examples of the smartphone mobile station also include a mobile station, specifically, a vehicle having a ceiling with the broadcast loudspeaker installed therein, and including the smartphone mobile unit, the audio amplifier, and the audio amplifier activation device built therein.

In the above-described example, the remote broadcast system according to the embodiment of the present invention is applied to a wireless emergency-management communication system to be used, for example, by a municipal staff member as a broadcaster. However, the remote broadcast system is not limited to the wireless emergency-management communication system to be used, for example, by the municipal staff member as the broadcaster. Specifically, the remote broadcast system is applicable also to a case where evacuation guidance information in case of natural disasters is broadcast, for example, in a department store, a shopping mall, and a supermarket that are crowded with shoppers, and in a school and a kindergarten where students commute.

In the above-described example of the remote broadcast system according to the embodiment of the present invention, smartphones are used as the base station and the mobile stations. However, the remote broadcast system may include, as the base station and the mobile stations, feature phones other than the smartphones, and portable information terminals including a wireless interface, such as a personal computer.

The above-described audio amplifier activation device according to the embodiment of the present invention includes the detector circuit configured to detect the level of the input sound via the smartphone mobile unit, and the comparator configured to compare the output from the detector circuit and the threshold to each other. However, the configuration of the audio amplifier activation device is not limited to that of the above-described audio amplifier activation device. For example, an audio amplifier activation signal may be transmitted from the smartphone base station such that ON/OFF control of the power source for the audio amplifier can be performed in response to this audio amplifier activation signal.

The present invention is not limited to the embodiment described above, and other various configurations and embodiments may be employed within the spirit and scope of the present invention.

10 smartphone base station (unit)
11, 31 antenna
12 touch panel
13 microphone
20 relay cloud server
30, 30-1, 30-2, ..., 30-n smartphone mobile station
32 smartphone mobile unit
33 audio output terminal
34 audio amplifier
35 audio amplifier activation device
36 broadcast loudspeaker
41 detector circuit
42 comparator
43 OFF timer
44 power switch
51 commercial power source
52 AC/DC converter
53 secondary battery
54 solar cell module
55 inverter

What is claimed is:

1. A remote broadcast system, comprising a communication link that constitutes a smartphone system, and includes a smartphone base station and a plurality of smartphone mobile stations, the smartphone base station and the plurality of smartphone mobile stations being connected communicably to each other via the communication link,
the smartphone base station including a smartphone base unit,
the plurality of smartphone mobile stations respectively including
smartphone mobile units,
the plurality of smartphone mobile stations each including
an audio amplifier configured to amplify, when electric power is supplied to the audio amplifier, input sound via corresponding one of the smartphone mobile units into a broadcast audio signal, and to output the broadcast audio signal,
an audio amplifier activation device configured to receive the input sound via the corresponding one of the smartphone mobile units, turn on the audio amplifier when a level of the input sound exceeds a threshold, and turn off the audio amplifier when the level of the input sound remains lower than the threshold for a predetermined time period, and
a broadcast loudspeaker configured to receive the broadcast audio signal, and broadcast the broadcast audio signal as broadcast sound,
the smartphone base unit being configured to select at least one of the smartphone mobile units, and cause the at least one of the smartphone mobile units to output the broadcast sound via the broadcast loudspeaker that is connected to the at least one of the smartphone mobile units via the audio amplifier,
the smartphone mobile units each being configured to transmit one of streaming videos and still images of a scene around corresponding one of the plurality of smartphone mobile stations to the smartphone base unit at predetermined time intervals.

2. The remote broadcast system according to claim 1, wherein the plurality of smartphone mobile stations each comprise:
a commercial power source;
a solar cell module; and
a secondary battery,
wherein, in normal times, normal times being at least one of times when there is no power failure or times when there is no emergency or disaster, the electric power is supplied from the commercial power source to corresponding one of the smartphone mobile units and the audio amplifier activation device of the corresponding one of the smartphone mobile units,
wherein, in normal times, the secondary battery is charged with the electric power generated by the commercial power source and electric power generated by the solar cell module, and
wherein, in case of a power failure, the electric power for the corresponding one of the smartphone mobile units and the audio amplifier activation device of the corresponding one of the smartphone mobile units is switched from the electric power generated by the commercial power source to electric power generated by the secondary battery and the electric power generated by the solar cell module.

3. The remote broadcast system according to claim 1, wherein the communication link that constitutes the smartphone system further includes a relay cloud server configured to receive an audio broadcast that is recorded via one of the smartphone base unit and a personal computer and is transferred therefrom, maintain the audio broadcast transferred therefrom as an audio file, and, at preset broadcast timings and a preset number of repetition times, transfer the audio file to the smartphone mobile units and broadcast the audio file.

4. The remote broadcast system according to claim 1, wherein the communication link that constitutes the smartphone system further includes a relay cloud server configured to receive a text message that is input via one of the smartphone base unit and a personal computer and is transferred therefrom, perform voice synthesis of the text message transferred therefrom so as to generate an audio file, maintain the audio file, and, at preset broadcast timings and a preset number of repetition times, transfer the audio file to the smartphone mobile units and broadcast the audio file.

\* \* \* \* \*